United States Patent
Kobayakawa et al.

(10) Patent No.: US 10,319,887 B2
(45) Date of Patent: Jun. 11, 2019

(54) SEMICONDUCTOR LIGHT-EMITTING DEVICE AND METHOD FOR MANUFACTURING THE SAME

(71) Applicant: ROHM CO., LTD., Kyoto-shi, Kyoto (JP)

(72) Inventors: Masahiko Kobayakawa, Kyoto (JP); Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/643,136

(22) Filed: Jul. 6, 2017

(65) Prior Publication Data

US 2018/0019383 A1 Jan. 18, 2018

(30) Foreign Application Priority Data

Jul. 13, 2016 (JP) .................................. 2016-138140

(51) Int. Cl.
*H01L 33/52* (2010.01)
*H01L 33/54* (2010.01)
(Continued)

(52) U.S. Cl.
CPC ............ *H01L 33/52* (2013.01); *H01L 33/005* (2013.01); *H01L 33/54* (2013.01); *H01L 33/62* (2013.01);
(Continued)

(58) Field of Classification Search
CPC ...................... H01L 33/52; H01L 33/54; H01L 2924/18301
(Continued)

(56) References Cited

U.S. PATENT DOCUMENTS

2008/0128739 A1* 6/2008 Sanpei ................. H05K 1/0203
257/99
2009/0141492 A1* 6/2009 Fujino ..................... H01L 33/60
362/249.02

(Continued)

FOREIGN PATENT DOCUMENTS

CN 102683509 A 9/2012
JP 2015-115432 A 6/2015

OTHER PUBLICATIONS

Office Action received in the corresponding Chinese Patent application, dated Dec. 26, 2018, and corresponding English translation (13 pages).

*Primary Examiner* — Matthew E Warren
(74) *Attorney, Agent, or Firm* — Hamre, Schumann, Mueller & Larson, P.C.

(57) ABSTRACT

A semiconductor light-emitting device includes a base, a light-emitting element and a sealing resin. The base includes an obverse surface and a reverse surface spaced in a first direction, first side surfaces spaced in a second direction crossing the first direction, and second side surfaces spaced in a third direction crossing the first and second directions. The light-emitting element is on the base obverse surface. The sealing resin for covering the light-emitting element is smaller than the base in plan. The base has a wiring pattern connected to the light-emitting element and including an obverse surface electrode on the base obverse surface. The base also has a resist layer including a pattern-covering portion overlapping with the obverse surface electrode. The pattern-covering portion includes a resin outflow preventing portion, disposed outside the sealing resin in plan and extends continuously from one second side surface to the other.

48 Claims, 15 Drawing Sheets

(51) Int. Cl.
*H01L 33/00* (2010.01)
*H01L 33/62* (2010.01)

(52) U.S. Cl.
CPC ............ *H01L 2224/48227* (2013.01); *H01L 2924/18301* (2013.01); *H01L 2933/005* (2013.01)

(58) Field of Classification Search
USPC .................................................. 257/98–100
See application file for complete search history.

(56) References Cited

U.S. PATENT DOCUMENTS

| | | | | |
|---|---|---|---|---|
| 2011/0284914 A1* | 11/2011 | Suzuki | ................. | H05K 1/0204 257/99 |
| 2012/0205710 A1* | 8/2012 | Kobayakawa | ........ | H01L 33/486 257/99 |
| 2017/0236984 A1* | 8/2017 | Heo | ...................... | H01L 33/507 257/98 |

* cited by examiner

FIG.16
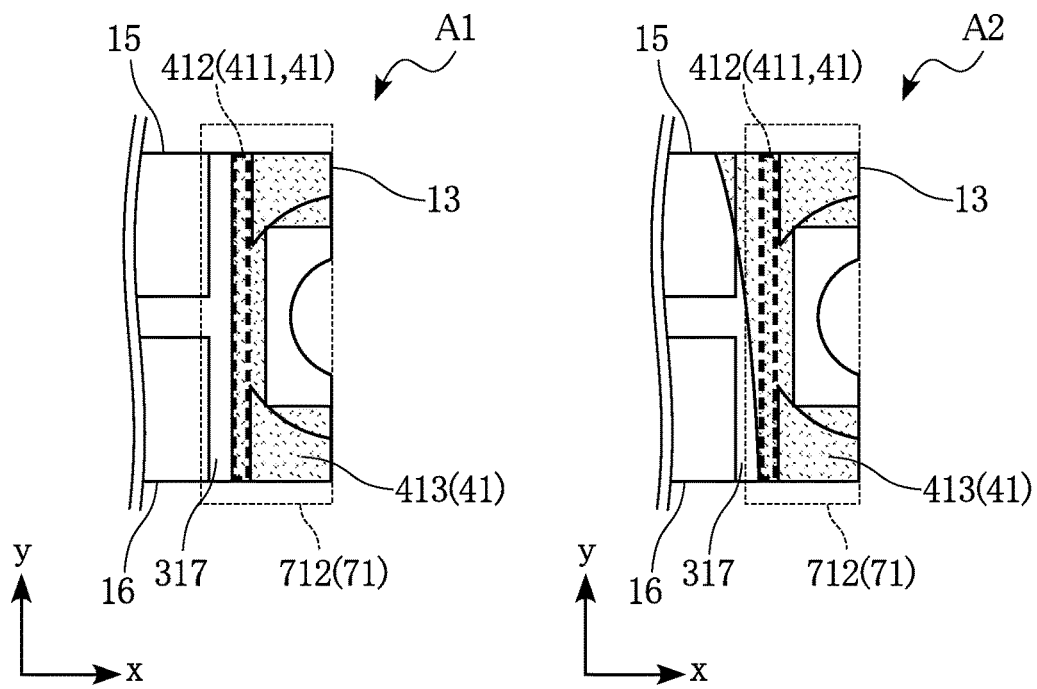
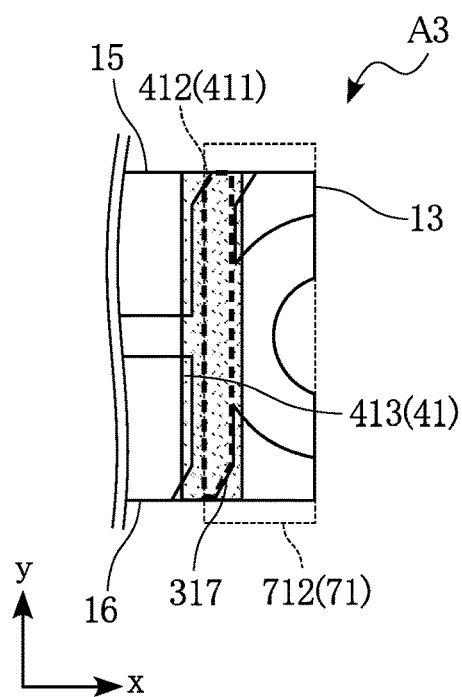

SEMICONDUCTOR LIGHT-EMITTING DEVICE AND METHOD FOR MANUFACTURING THE SAME

FIELD

The present disclosure relates to a semiconductor light-emitting device. The present disclosure also relates to a method for manufacturing a semiconductor light-emitting device.

BACKGROUND

An example of conventional semiconductor light-emitting device is disclosed in JP-A-2015-115432. In the semiconductor light-emitting device of this document, a wiring pattern and a resist layer are formed on a base. Further, a semiconductor light-emitting element is mounted on the base and is covered with a sealing resin.

In the above-described conventional semiconductor light-emitting device, steps (i.e., height differences) are inevitably generated at some locations on the base due to the presence or absence of the wiring pattern and the resist layer. Specifically, there are portions where both the wiring pattern and the resist layer are formed, and portions where only one of the wiring pattern and the resist layer is formed, and portions where neither of them is formed. Thus, steps are present on the surface of the substrate. Such steps cause the following problems.

In forming a sealing resin by molding, the base is sandwiched between a pair of molds that forms a predetermined cavity. At this time, a gap may be formed between the mold and the base due to the presence of a step described above. With such a gap, the liquid resin injected into the cavity may leak from the gap, which may cause various troubles. For example, the leaked resin may cover the terminal portion for external connection, so that the planned conduction path cannot be secured. Further, when the leaked resin is solidified to form burrs, an otherwise unnecessary process for removing the burrs is required.

SUMMARY

The present disclosure is made in view of the above circumstances. It is therefore an object of the present disclosure to teach a semiconductor light-emitting device that can prevent the problems caused by the above-described step and a method for manufacturing such a semiconductor light-emitting device.

According to a first aspect of the present disclosure, a semiconductor light-emitting device is provided. The semiconductor light-emitting device includes a base having a base obverse surface and a base reverse surface that are spaced apart from each other in a first direction, and having a pair of first side surfaces that are spaced apart from each other in a second direction perpendicular to the first direction, and having a pair of second side surfaces that are spaced apart from each other in a third direction perpendicular to the first direction and the second direction. The semiconductor light-emitting device further includes a semiconductor light-emitting element mounted on the base obverse surface; a light-transmitting sealing resin covering the semiconductor light-emitting element and having a smaller dimension than the base as viewed in the first direction; a wiring pattern electrically connected to the semiconductor light-emitting element and including an obverse surface electrode formed on the base obverse surface; and an insulating resist layer including a pattern-covering portion overlapping with the obverse surface electrode as viewed in the first direction. The pattern-covering portion includes a resin outflow preventing portion. As viewed in the first direction, the resin outflow preventing portion is disposed outside the sealing resin and extends continuously from one of the paired second side surfaces to the other one of the paired second side surfaces.

According to a second aspect of the present disclosure, a method for manufacturing a semiconductor light-emitting device is provided. The method includes a base preparing step of preparing a base having a first side edge and a second side edge parallel to each other; a wiring pattern forming step of forming a wiring pattern on the base; a resist forming step of forming a resist layer on the base to cover a part of the wiring pattern; a die bonding step of disposing a semiconductor light-emitting element on the base; and a resin molding step of forming a sealing resin covering the semiconductor light-emitting element by sandwiching the base between a first mold and a second mold and injecting a resin material into a recess of the first mold. The formation of the wiring pattern and the formation of the resist are performed such that a resin outflow preventing portion extending continuously from the first side edge to the second side edge of the base will be formed. The resin outflow preventing portion is configured to come into contact with a bottom surface of the first mold over an entire region from the first side edge to the second side edge of the base.

In the semiconductor light-emitting device of the present disclosure, the pattern-covering portion has a resin outflow preventing portion. Owing to the resin outflow preventing portion, when the base is sandwiched between a pair of molds in a resin molding step, a gap, which has conventionally been a problem, is not formed, because the resin outflow preventing portion comes into contact with one of the molds. Thus, the liquid resin injected into the cavity in the mold is prevented from leaking.

BRIEF DESCRIPTION OF THE DRAWINGS

FIG. 16 illustrates a semiconductor light-emitting device according to a plurality of variations of the present disclosure.

DESCRIPTION OF THE PREFERRED EMBODIMENTS

Preferred embodiments of semiconductor light-emitting devices and methods for manufacturing such devices are described below with reference to the drawings.

Figure 4:
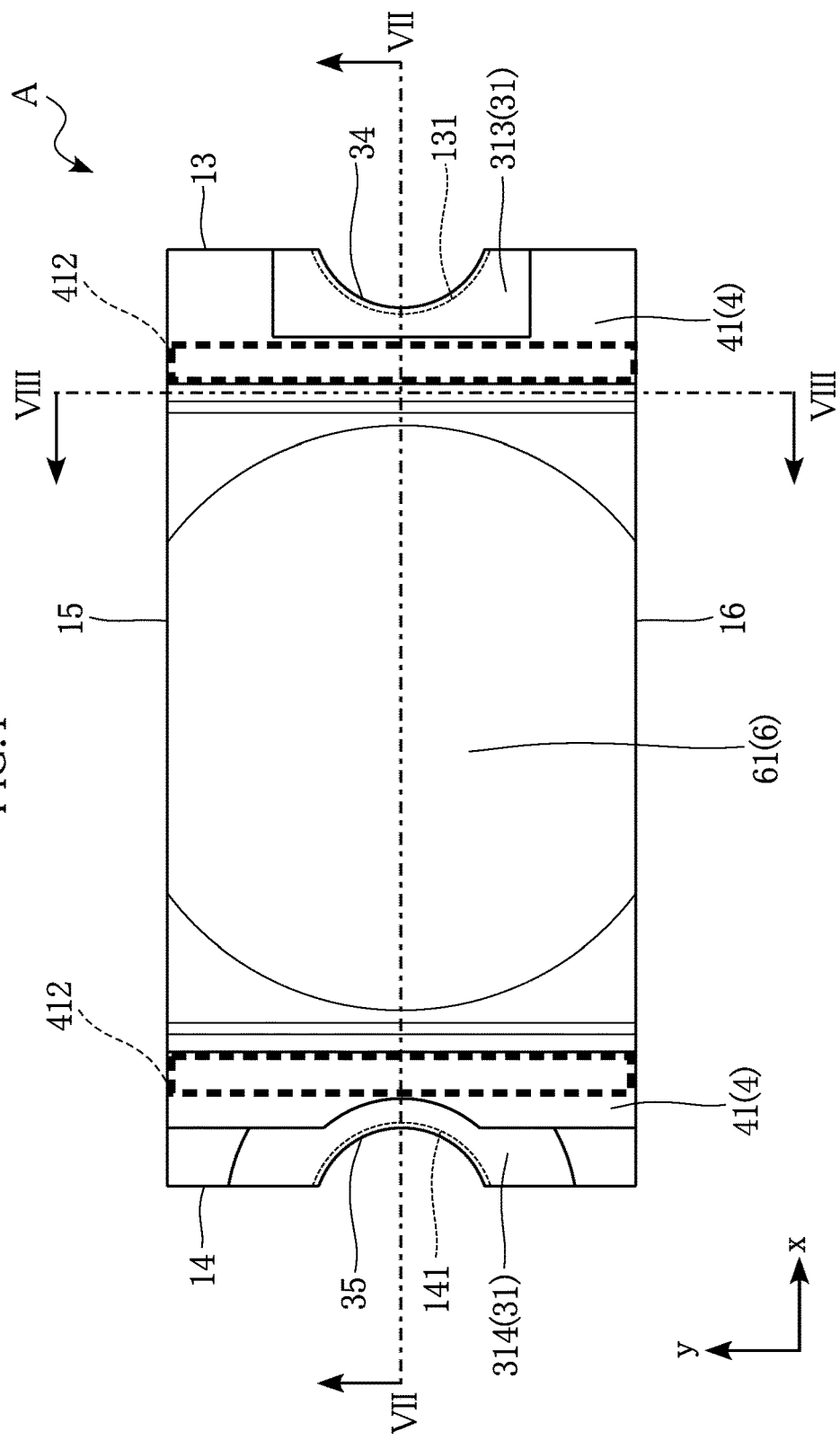
FIG. 4 is a plan view of the semiconductor light-emitting device.
Figure 5:
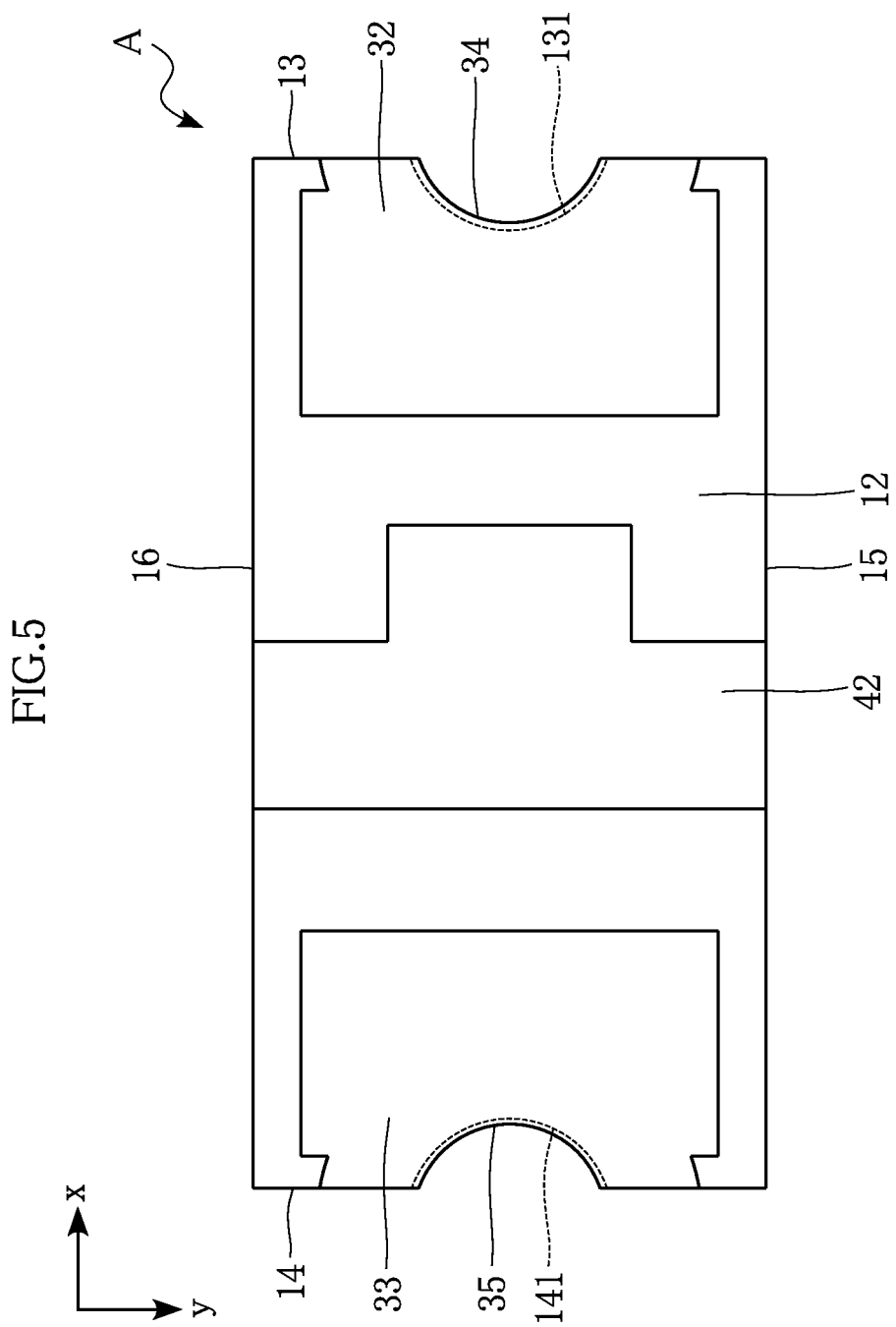
FIG. 5 is a bottom view of the semiconductor light-emitting device.
Figure 6:
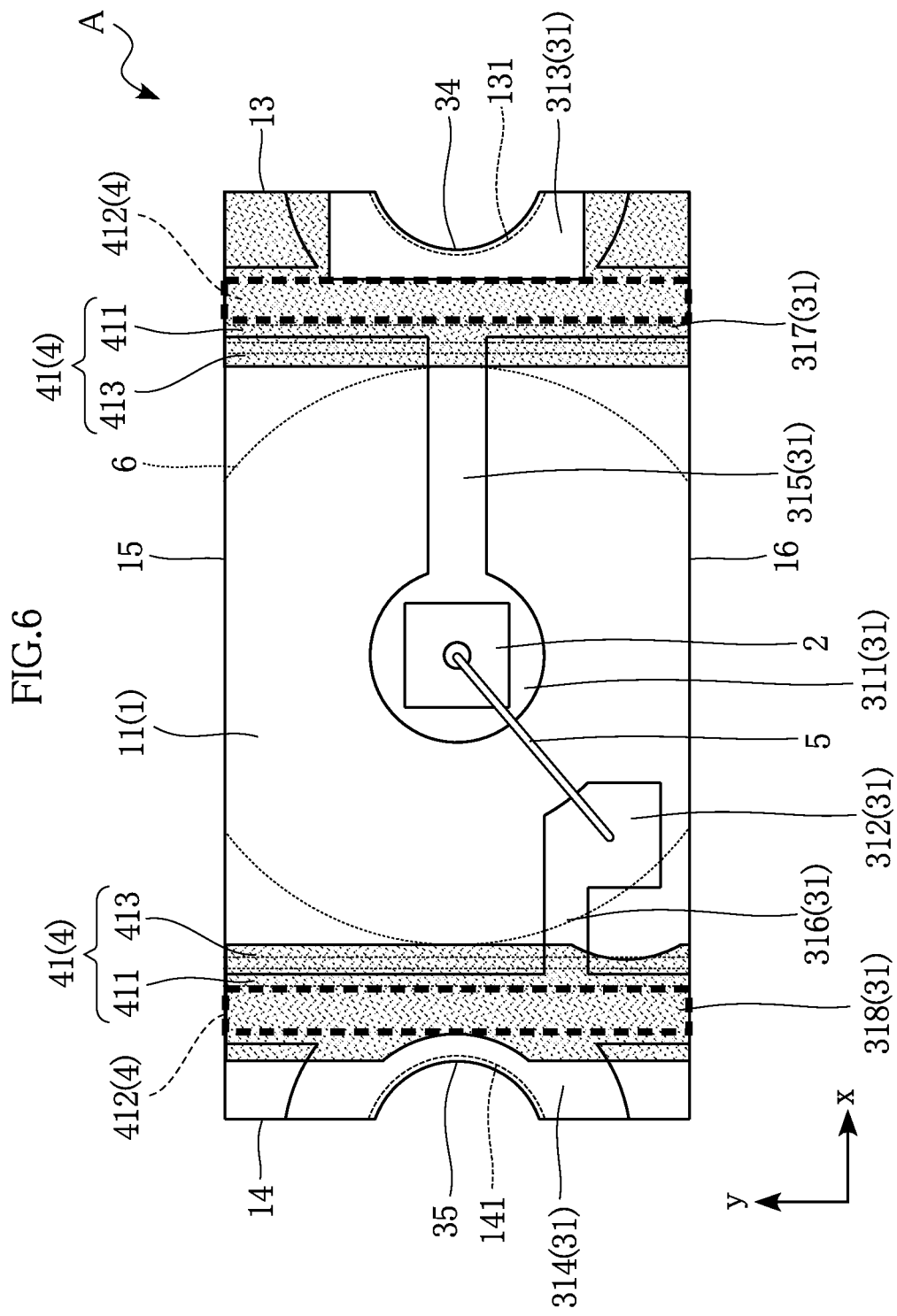
FIG. 6 is a plan view showing the internal configuration of the semiconductor light-emitting device.

FIG. 1 to FIG. 8 show a semiconductor light-emitting device A according to an embodiment of the present disclosure. The illustrated semiconductor light-emitting device A includes a base 1, a semiconductor light-emitting element 2, a wiring pattern 3, a resist layer 4, a wire 5, and a sealing resin 6. FIG. 6 shows the internal configuration of the semiconductor light-emitting device A by passing through the sealing resin 6 in FIG. 4. Further, in the drawings, the resist layer 4 is stippled and illustrated such that portions behind the resist layer 4 can be seen through the resist layer 4.

In FIGS. 1 to 8, the direction penetrating the thickness of the base 1 is defined as z direction. The two directions perpendicular to the z direction and also perpendicular to each other are defined as x direction and y direction, respectively. In each direction, the orientation to which the arrow points is defined as the forward side, and the opposite orientation is defined as the backward side.

The base 1 is made of an insulating material. Examples of such a material include an insulating resin and a ceramic. Examples of the insulating resin include glass epoxy resin. Examples of the ceramic include $Al_2O_3$, SiC, or AlN. Note that the base 1 may be provided by forming an insulating film on a substrate made of a metal such as aluminum. The base 1 is rectangular as viewed in the z direction. The base 1 is elongate in the x direction. In the present embodiment, the dimension of the base 1 in the z direction (thickness) is 400 μm. The base 1 has an obverse surface 11, a reverse surface 12, a pair of first side surfaces 13, 14 and a pair of second side surfaces 15, 16.

Figure 1:
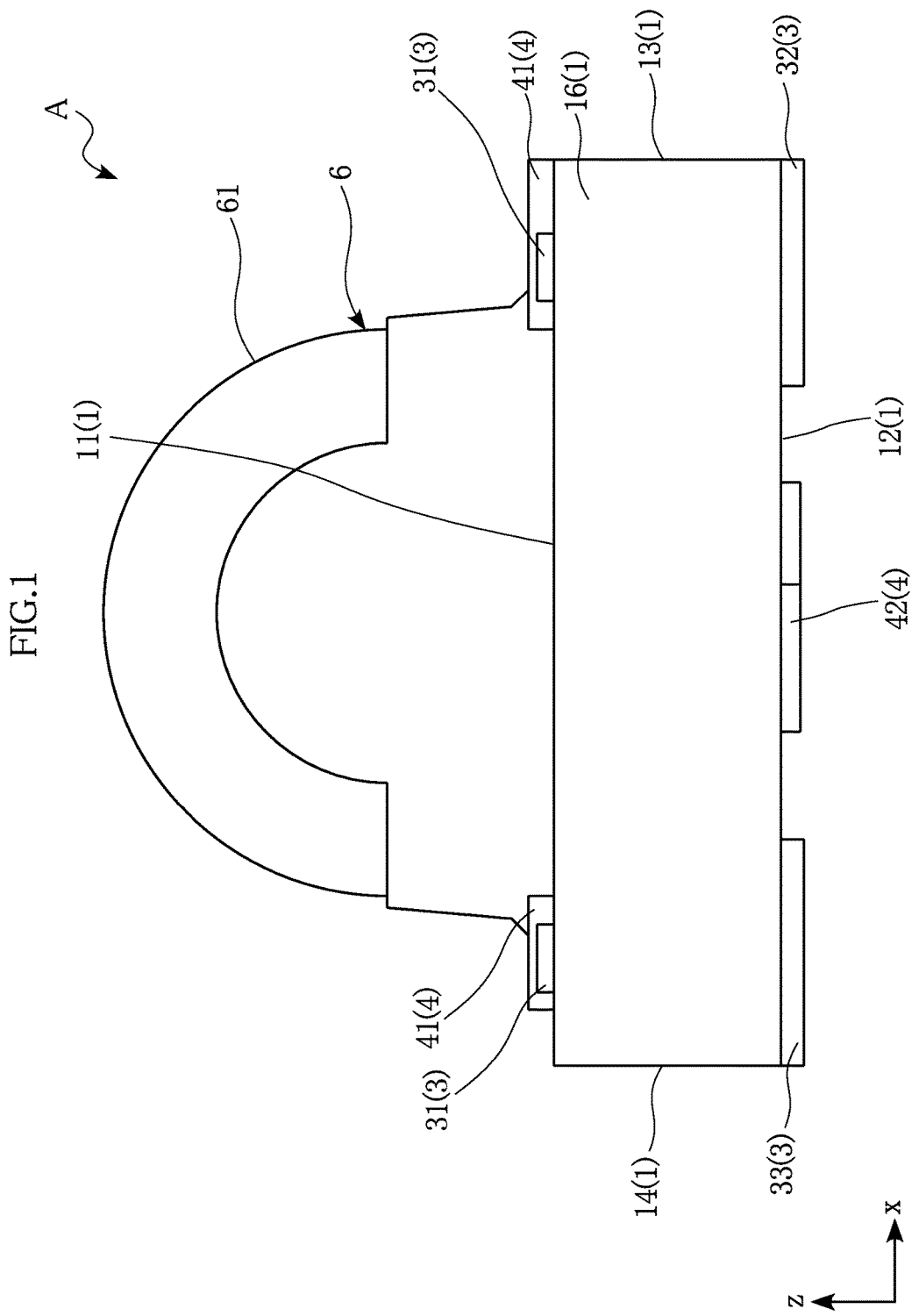
FIG. 1 is a front view of a semiconductor light-emitting device according to an embodiment of the present disclosure.
Figure 2:
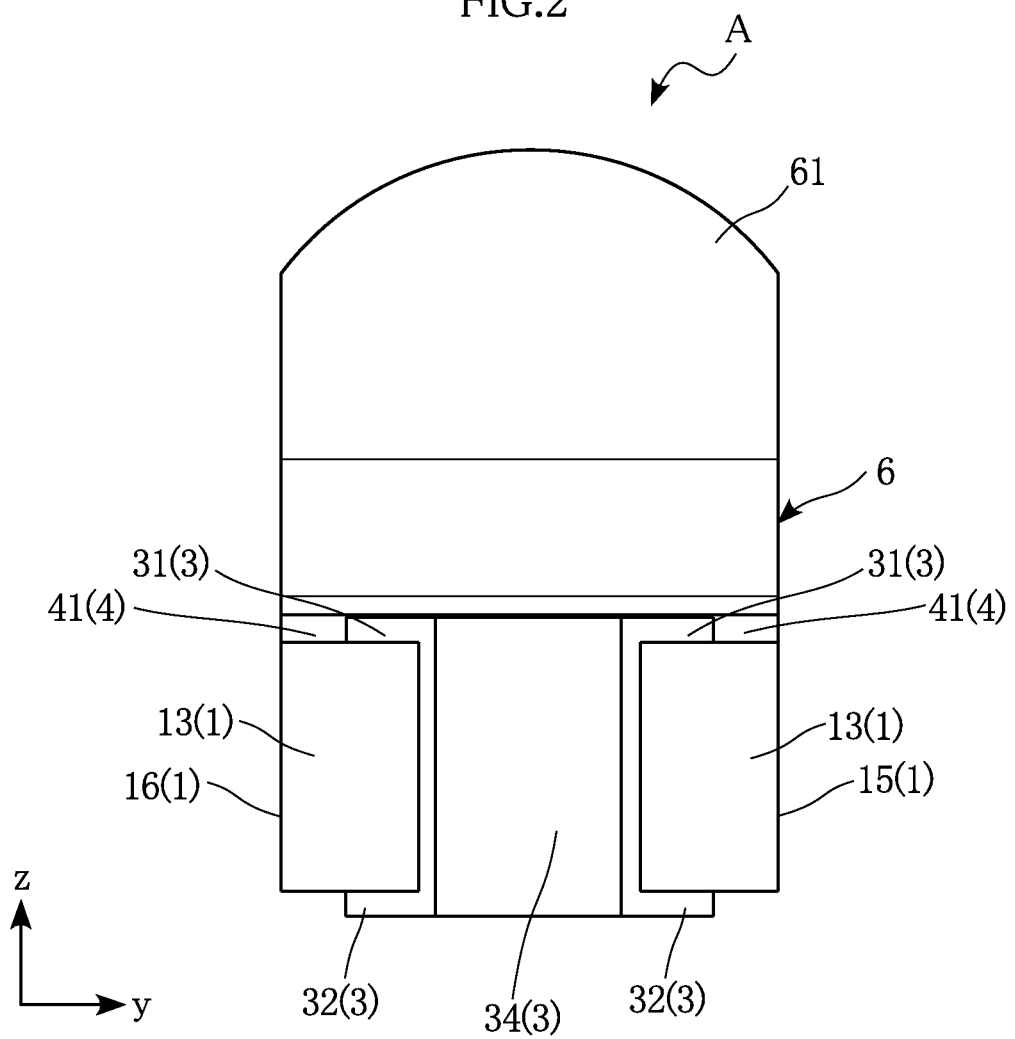
FIG. 2 is a right side view of the semiconductor light-emitting device.
Figure 3:
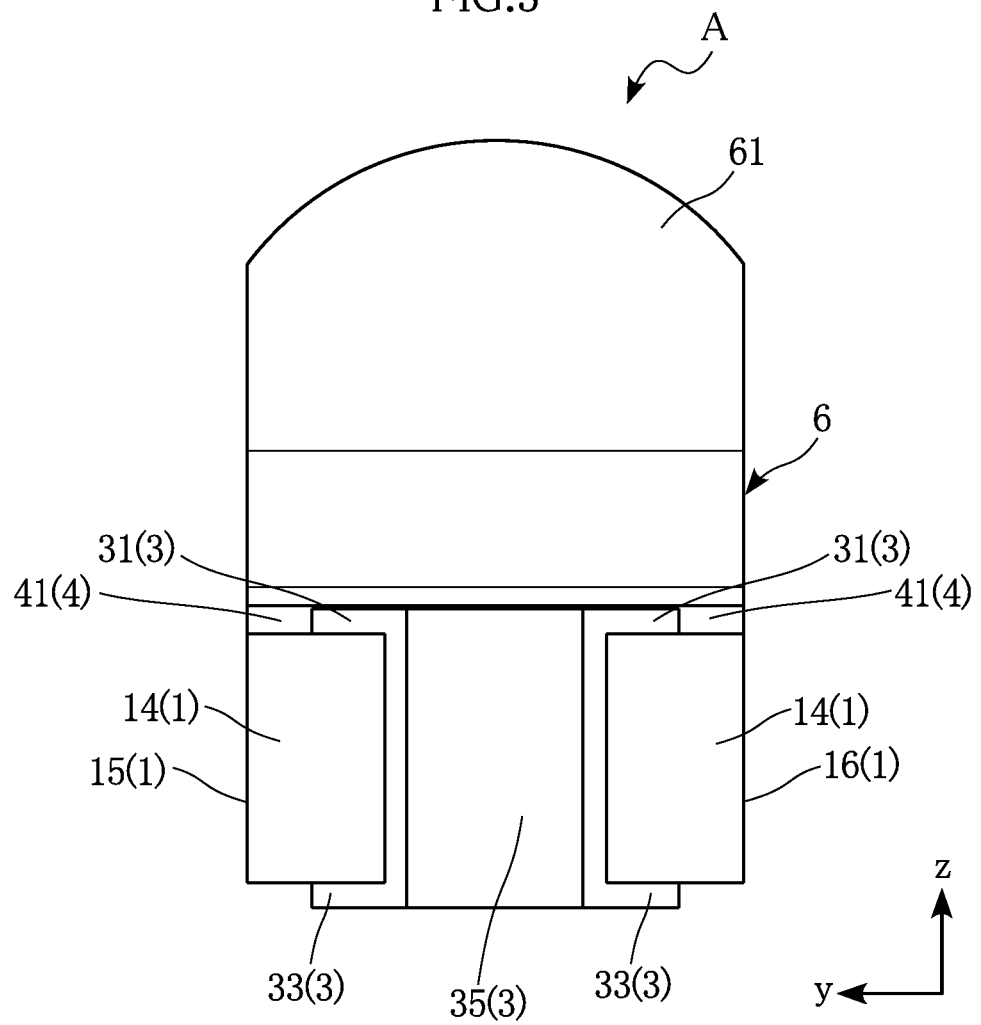
FIG. 3 is a left side view of the semiconductor light-emitting device.
Figure 7:
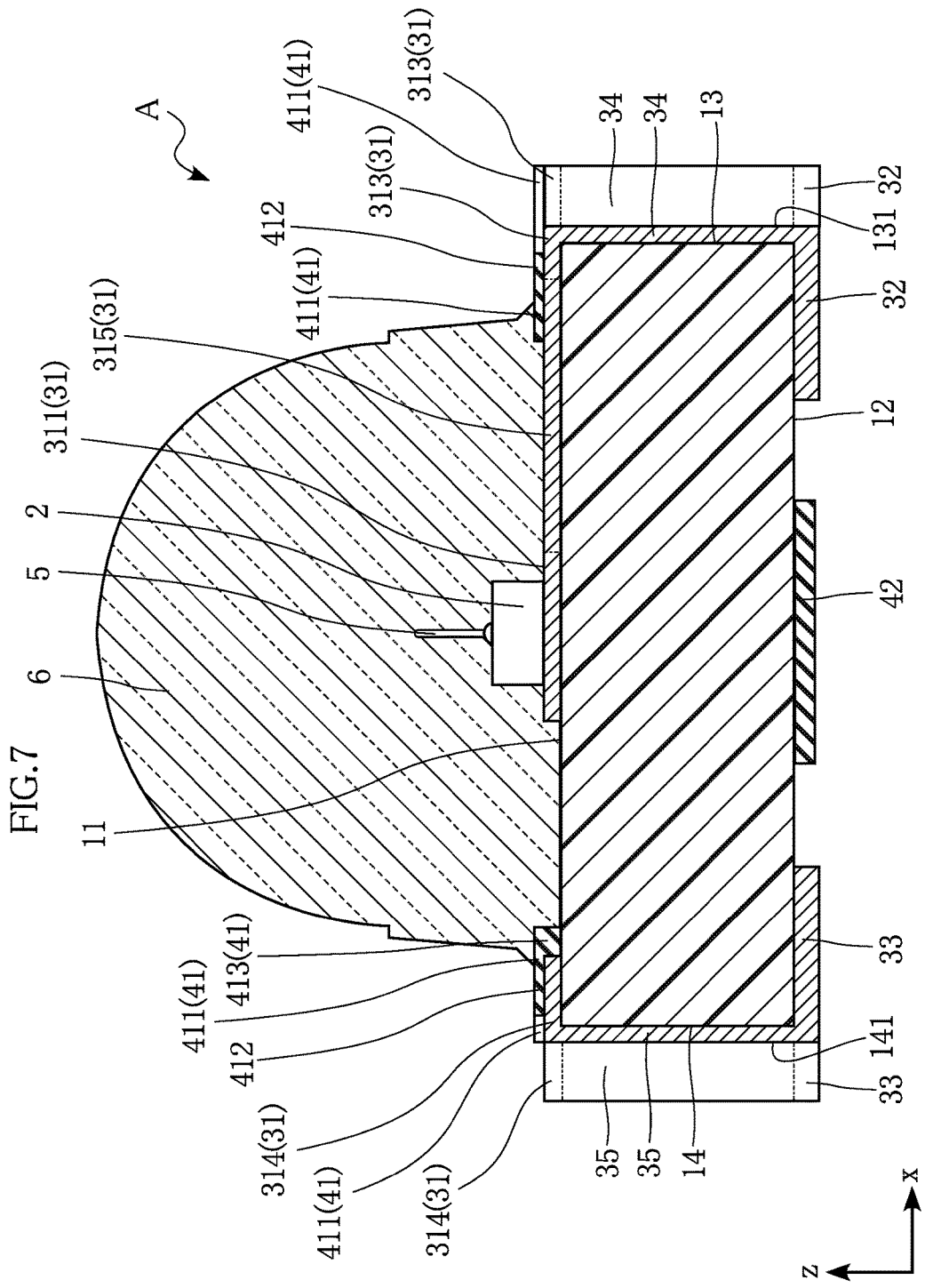
FIG. 7 is a sectional view taken along line VII-VII in FIG. 4.
Figure 8:
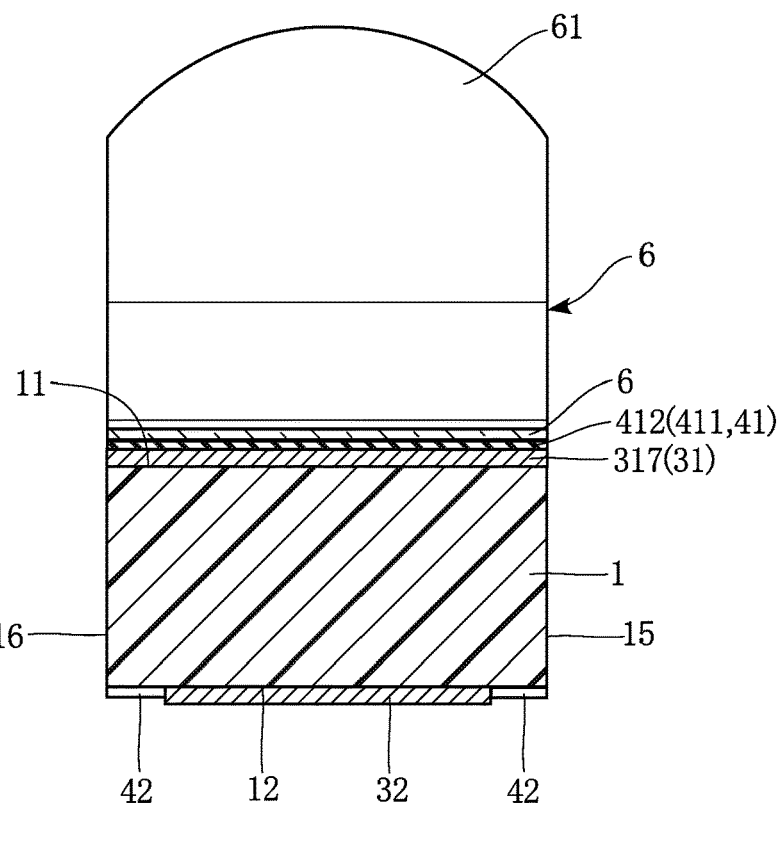
FIG. 8 is a sectional view taken along line VIII-VIII in FIG. 4.

As shown in FIGS. 1, 7 and 8, the obverse surface 11 and the reverse surface 12 are spaced apart from each other in the z direction. The obverse surface 11 faces forward in the z direction (hereinafter referred to as "upward") and the reverse surface 12 faces backward in the z direction (hereinafter referred to as "downward"). The obverse surface 11 and the reverse surface 12 are both flat.

As shown in FIGS. 1 and 4-6, the paired first side surfaces 13 and 14 are spaced apart from each other in the x direction. Both of the paired first side surfaces 13, 14 are connected at their upper edges to the obverse surface 11 and at their lower edges to the reverse surface 12. The first side surfaces 13 and 14 are formed with grooves 131 and 141, respectively. Each of the first side surfaces 13 and 14 has two flat portions flush with each other with the groove 131 or 141 between them.

The groove 131 is recessed from the first side face 13 toward the inside of the base 1. The groove 141 is recessed from the first side surface 14 toward the inside of the base 1. Both of the two grooves 131 and 141 extend from the obverse surface 11 to the reverse surface 12. In the present embodiment, both of the two grooves 131, 141 are semicircular as viewed in the z direction.

As shown in FIGS. 2 to 6 and 8, the second side surfaces 15 and 16 are spaced apart from each other in the y direction. Both of the paired second side surfaces 15, 16 are connected at their upper edges to the obverse surface 11 and at their lower edges to the reverse surface 12. Both of the second side surfaces 15 and 16 are entirely flat.

The semiconductor light-emitting element 2 is a light source of the semiconductor light-emitting device A. Note that the configuration of the present disclosure can also be applied to electronic devices other than light-emitting devices. For example, instead of the semiconductor light-emitting element 2, a light-receiving element or a diode may be used. The semiconductor light-emitting element 2 has an n-type semiconductor layer, an active layer, and a p-type semiconductor layer. The n-type semiconductor layer is stacked on the active layer, and the active layer is stacked on the p-type semiconductor layer. The active layer is located between the n-type semiconductor layer and the p-type semiconductor layer. The n-type semiconductor layer, the active layer, and the p-type semiconductor layer are made of, for example, GaN. The semiconductor light-emitting element 2 has a first pad portion on a surface facing upward and a second pad portion on a surface facing downward. The semiconductor light-emitting element 2 is mounted on the base 1. The color of the light emitted by the semiconductor light-emitting element 2 is not particularly limited, and may be red, green or blue, for example.

The wiring pattern 3 serves as a path for supplying electric power to the semiconductor light-emitting element 2. The wiring pattern 3 is electrically connected to the semiconductor light-emitting element 2. The wiring pattern 3 may be made of a single kind or plural kinds of metals such as Cu, Ni, Ti or Au. The wiring pattern 3 is formed on the base 1. In the present embodiment, the wiring pattern 3 is made up of a Cu foil and a Cu plating layer. The Cu foil is formed on the base 1 and has a thickness (dimension in the z direction) of 18 μm. The Cu plating layer is formed on the Cu foil and has a thickness of 15 μm. Thus, the wiring pattern 3 has a thickness of 33 μm. The configuration and the thickness of the wiring pattern 3 are not limited to this. The wiring pattern 3 includes an obverse surface electrode 31, a plurality of reverse surface electrodes 32, 33, and a plurality of side surface electrodes 34, 35.

The obverse surface electrode 31 is formed on the obverse surface 11 of the base 1. The obverse surface electrode 31 includes a plurality of portions, for example, a die bonding portion 311, a wire bonding portion 312, a first end edge portion 313, a second end edge portion 314, a first connecting portion 315, a second connecting portion 316, a first strip portion 317, and a second strip portion 318.

The die bonding portion 311 is a portion to which the semiconductor light-emitting element 2 is fixed. In the present embodiment, the surface facing upward of the die bonding portion 311 and the second pad portion of the semiconductor light-emitting element 2 face each other and are bonded to each other with a conductive bonding material. Examples of the bonding material include solder and Ag paste. Further, although the die bonding portion 311 is a circular as viewed in the z direction in the present embodiment, the die bonding portion 311 may be, for example, rectangular or polygonal.

The wire bonding portion 312 is a portion to which a wire 5 is bonded. Although the wire bonding portion 312 has a substantially rectangular shape as viewed in the z direction in the present embodiment, the wire bonding portion 312 may have another shape.

The first end edge portion 313 is provided close to one groove 131. The second end edge portion 314 is provided close to the other groove 141. In the present embodiment, both the first end edge portion 313 and the second end edge portion 314 are semi-circular as viewed in the z direction (see FIG. 6 or FIG. 10 etc.). In the present embodiment, as shown in FIGS. 4 and 6, each of the first end edge portion 313 and the second end edge portion 314 is partially exposed from the resist layer 4 and the sealing resin 6. The exposed portions are plated with Au for preventing corrosion.

The first connecting portion 315 connects the die bonding portion 311 and the first end edge portion 313. The second connecting portion 316 connects the wire bonding portion 312 and the second end edge portion 314. In the present embodiment, both the first connecting portion 315 and the second connecting portion 316 are in the form of a strip and extend in the x direction.

The obverse surface 11 has two side edges spaced apart from each other in the y direction. Both of the first strip portion 317 and the second strip portion 318 extend from one side edge to the other side edge of the obverse surface 11. In the present embodiment, the first strip portion 317 is disposed forward of the center of the obverse surface 11 in the x direction. The second strip portion 318 is disposed backward of the center of the obverse surface 11 in the x direction. In the present embodiment, the first strip portion 317 is connected to the first end edge portion 313 and the first connecting portion 315. The second strip portion 318 is connected to the second end edge portion 314 and the second connecting portion 316.

The reverse surface electrodes 32 and 33 are formed on the reverse surface 12. The reverse surface electrode 32 and 33 are joint portions at the time of mounting the semiconductor light-emitting device A on a mounting board or the like. The reverse surface electrode 32 and 33 are spaced apart from each other in the x direction and insulated from each other. The reverse surface electrode 32 is disposed forward of the center of the reverse surface 12 in the x direction. The reverse surface electrode 33 is disposed backward of the center of the reverse surface 12 in the x direction.

The side surface electrode 34 covers the groove 131, and the side surface electrode 35 covers the groove 141. The side surface electrodes 34 and 35 extend from the obverse surface 11 to the reverse surface 12. The side surface electrode 34 is connected at its upper edge to the first end edge portion 313 and at its lower edge to the reverse surface electrode 32. Thus, the second pad portion of the semiconductor light-emitting element 2 is electrically connected to the reverse surface electrode 32 via the die bonding portion 311, the first connecting portion 315, the first end edge portion 313 and the side surface electrode 34. The side surface electrode 35 is connected at its upper edge to the second end edge portion 314 and at its lower edge to the reverse surface electrode 33.

The resist layer 4 is made of an insulating material and formed on the base 1. For easier understanding, the resist layer 4 is stippled in some of the figures. The resist layer 4 includes an obverse-side resist 41 and a reverse-side resist 42.

The obverse-side resist 41 is formed on the obverse surface of the base 1. The obverse-side resist 41 is formed by attaching a film resist to the obverse surface 11 by pressure bonding and then curing the film. Due to the pressure applied in pressure-bonding, the surface facing upward of the obverse-side resist 41 is flat. The obverse-side resist 41 includes a plurality of pattern-covering portions 411 and a plurality of base-covering portions 413.

The pattern-covering portions 411 are portions that overlap with the wiring pattern 3 as viewed in the z direction. Each of the pattern-covering portions 411 is in contact with a corresponding portion of the wiring pattern 3. The pattern-covering portions 411 have flat upper surfaces. In the present embodiment, the first strip portion 317 and the second strip portion 318 are entirely covered with the pattern-covering portions 411. In the present embodiment, the pattern-covering portions 411 are 15 μm in thickness.

In the present embodiment, the pattern-covering portions 411 include resin outflow preventing portions 412. The resin outflow preventing portions 412 are portions that come into contact with a mold 71 used in a resin molding step (described later). The resin outflow preventing portions 412 are positioned outside (in the x direction) of the sealing resin 6 as viewed in the z direction. The resin outflow preventing portions 412 extend continuously from one second side surface 15 to the other second side surface 16 in the y direction. In the present embodiment, the resin outflow preventing portions 412 are rectangular as viewed in the z direction. The upper surfaces of the resin outflow preventing portions 412 are flat and positioned at the uppermost position in the resist layer 4. For easier understanding, the resin outflow prevention portions 412 are indicated by thick dotted lines in some of the drawings (FIG. 4, FIG. 6, etc.).

The base-covering portions 413 are portions that do not overlap with the wiring pattern 3 as viewed in the z direction. That is, the base-covering portions 413 are in contact with the base 1. In the present embodiment, the thickness of the base-covering portions 413 is smaller than the sum of the thickness of the wiring pattern 3 and the thickness of the pattern-covering portions 411. For example, the thickness of the base-covering portions 413 is 40 μm.

The reverse-side resist 42 is formed on the reverse surface 12 of the base 1. As shown in FIG. 5, the reverse-side resist 42 is formed in the vicinity of the center in the x direction of the reverse surface 12 and connected to opposite side edges (spaced apart from each other in the y direction) of the reverse surface 12. The reverse-side resist 42 has a flat lower surface. In the present embodiment, the reverse-side resist 42 is 20 μm in thickness. The reverse-side resist 42 has a convex portion protruding forward in the x direction. With such a shape, the reverse-side resist 42 serves as a mark for judging the connection direction of the semiconductor light-emitting device A. The reverse-side resist 42 is formed by applying a liquid resist to the reverse surface 12 and thermally curing it. Note that the reverse-side resist 42 may be formed using a film resist, similarly to the obverse-side resist 41.

The wire 5 electrically connects the semiconductor light-emitting element 2 and the wiring pattern 3. The wire 5 is made of a metal such as Au. One end of the wire 5 is fixed to the first pad portion of the semiconductor light-emitting element 2, and the other end is fixed to the wire bonding portion 312. Thus, the first pad portion of the semiconductor light-emitting element 2 is electrically connected to the reverse surface electrode 33 via the wire 5, the wire bonding portion 312, the second connecting portion 316, the second end edge portion 314 and the side surface electrode 35.

The sealing resin 6 covers the semiconductor light-emitting element 2, a part of the wiring pattern 3, a part of the resist layer 4 and the wire 5. The sealing resin 6 is made of a resin material that transmits light. Examples of such a resin material include a transparent or translucent resin such as an epoxy resin, a silicone resin, an acrylic resin, or a polyvinyl-based resin. The sealing resin 6 may contain a fluorescent material. In this case, the fluorescent material is excited by the light (first light) of the semiconductor light-emitting element 2 to emit light (second light) having a wavelength different from that of the first light.

The sealing resin 6 is formed by molding in the resin molding step (described later). The size of the sealing resin 6 in the x direction is smaller than that of the base 1. The resin sealing portion 6 has a dome portion 61.

The dome portion 61 has a hemispherical shape and protrudes upward. The dome portion 61 serves as a convex lens. The light emitted from the semiconductor light-emitting element 2 is directed in a predetermined direction by the dome part 61. The sealing resin 6 is not limited to the shape having the dome portion 61. For example, when diffusing the light emitted from the semiconductor light-emitting element 2, the upper surface of the sealing resin 6 may be a concave surface.

Next, a method for manufacturing the semiconductor light-emitting device A is described with reference to FIGS. 9 to 15. In the illustrated method, a plurality of semiconductor light-emitting devices A are collectively manufactured, but the manufacturing method of the present disclosure is not limited thereto. As described below, the manufacturing method of the semiconductor light-emitting device A includes a base preparing step, a wiring pattern forming step, a resist forming step, a bonding step, and a resin molding step.

Figure 9:
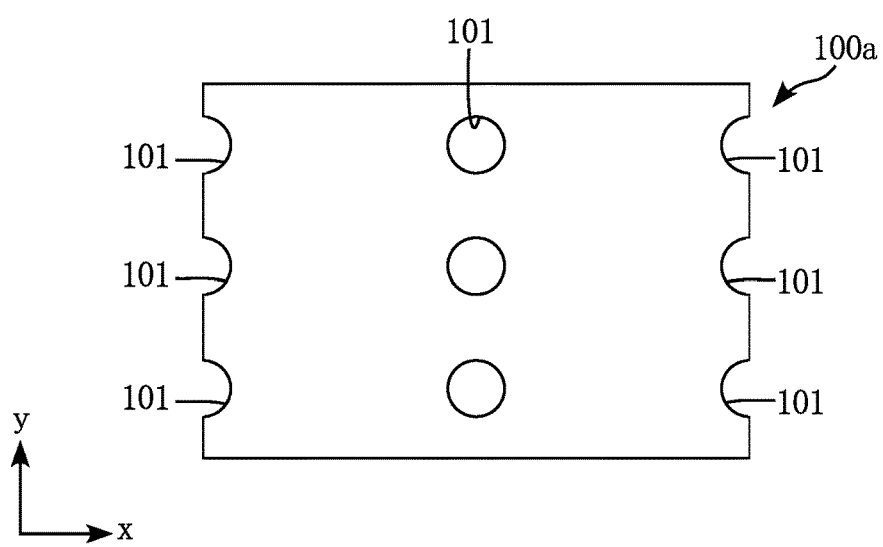
FIG. 9 illustrates a manufacturing method of the present disclosure, showing an aggregate base after a base preparing step.

As shown in FIG. 9, an aggregate base 100a is prepared in the base preparing step. The aggregate base 100a is generally rectangular. In the aggregate base 100a, a plurality of through-holes 101 are formed in a matrix. In the illustrated example, the "through-holes" 101 formed on the left and right end surfaces of the aggregate base 100a are actually grooves, but for convenience of terminology, these are also referred to as "through-holes" below.

The aggregate base 100a has such a size that can form a plurality of bases 1 shown in FIGS. 1 to 8. In the present embodiment, the aggregate base material 100a can form six bases 1. The plurality of through-holes 101 include six semicircular through-holes 101 and three circular through-holes 101. The plurality of through-holes 101 are formed, for example, by punching the base. The aggregate base 100a is made of, for example, a glass epoxy resin.

Figure 10:
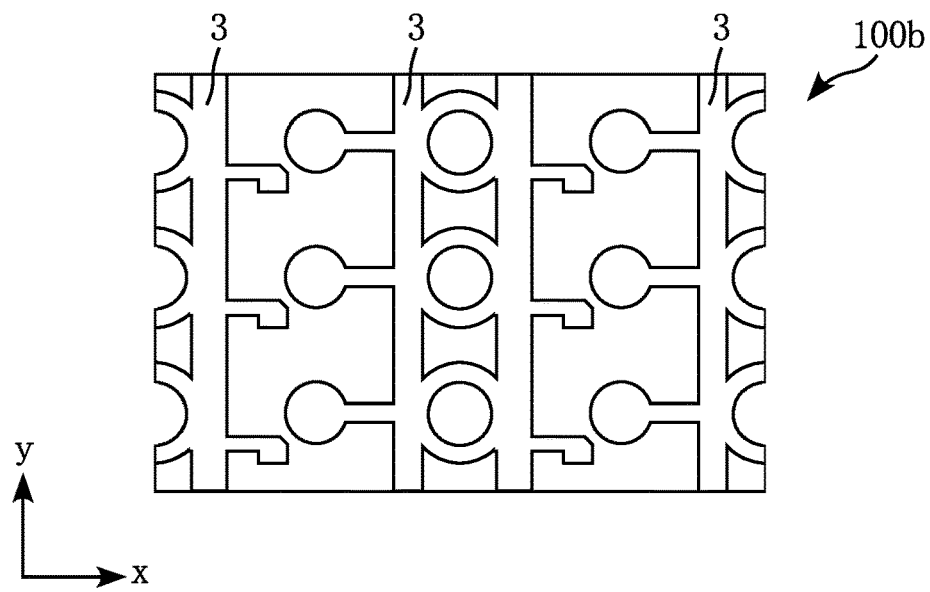
FIG. 10 illustrates a manufacturing method of the present disclosure, showing an aggregate base after a wiring pattern forming step.

As shown in FIG. 10, a wiring pattern 3 is formed on the aggregate base 100a in the wiring pattern forming step. The wiring pattern 3 is formed by forming a Cu foil on the aggregate base 100a and then plating the Cu foil with Cu. By the wiring pattern forming step, the aggregate base 100b shown in FIG. 10 (the aggregate base 100a on which the wiring pattern 3 is formed) is obtained.

Figure 11:
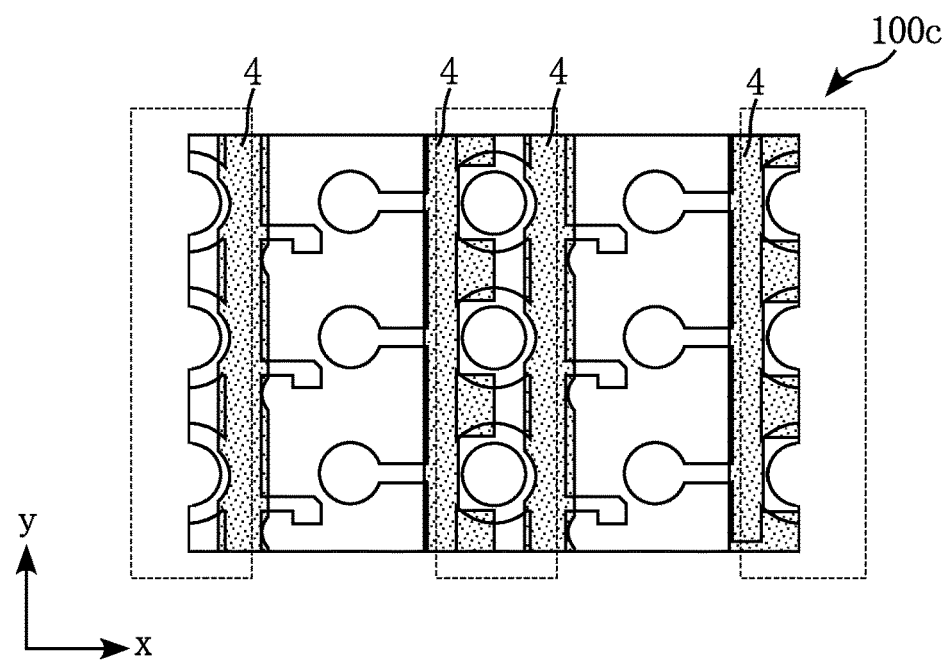
FIG. 11 illustrates a manufacturing method of the present disclosure, showing an aggregate base after a resist forming step.

As shown in FIG. 11, in the resist forming step, a resist layer 4 is formed in a predetermined region on the aggregate base 100b. Specifically, a film resist is attached by pressure-bonding to the upper surface of the aggregate base 100b. Then, the attached resist is cured by exposure to suitable light, for example. Thus, the obverse-side resist 41 is formed (see FIG. 6). Further, a liquid resist is applied to the reverse surface of the aggregate base 100b. Then, the applied resist is cured. Thus, the reverse-side resist 42 is formed (see FIG. 7). By the resist forming step, the aggregate base 100c shown in FIG. 11 (the aggregate base 100b on which the resist layer 4 is formed) is obtained. In the resist forming step, the upper surface of the obverse-side resist 41 will be flattened by the pressure applied in the pressure bonding. The obverse-side resist 41 includes pattern-covering portions 411 and base-covering portions 413. The pattern-covering portions 411 are portions that are formed by pressure-bonding onto the wiring pattern 3. The base-covering portions 413 are portions that are formed by pressure-bonding onto portions of the aggregate base 100b where the wiring pattern 3 is not formed. After the resist forming step, Au plating is applied to the exposed portions of the wiring pattern 3 (the portions exposed from the resist layer 4 and also exposed from the sealing resin 6 to be formed later).

Figure 12:
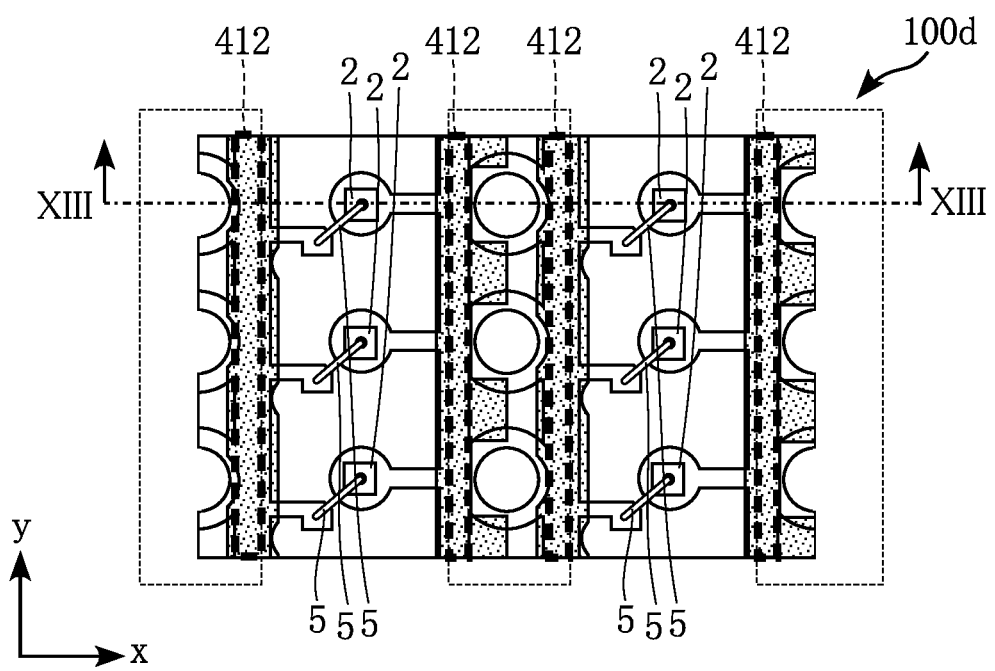
FIG. 12 illustrates a manufacturing method of the present disclosure, showing an aggregate base after a bonding step.

As shown in FIG. 12, in the bonding step, first, a plurality of semiconductor light-emitting elements 2 are bonded to predetermined positions on the upper surface of the aggregate base 100c. This die bonding can be carried out by a known method. Then, the first pad portion of each semiconductor light-emitting element 2 and the corresponding wire bonding portion 312 (see FIG. 6) are connected by a wire 5. This wire bonding can also be carried by a known method. By the bonding steps (die bonding step and wire bonding step), electrical conduction between each semiconductor light-emitting element 2 and the wiring pattern 3 is secured. By the bonding steps, the aggregate base 100d shown in FIG. 12 (the aggregate base 100c on which a plurality of semiconductor light-emitting elements 2 and a plurality of wires 5 are provided) is obtained.

Figure 13:
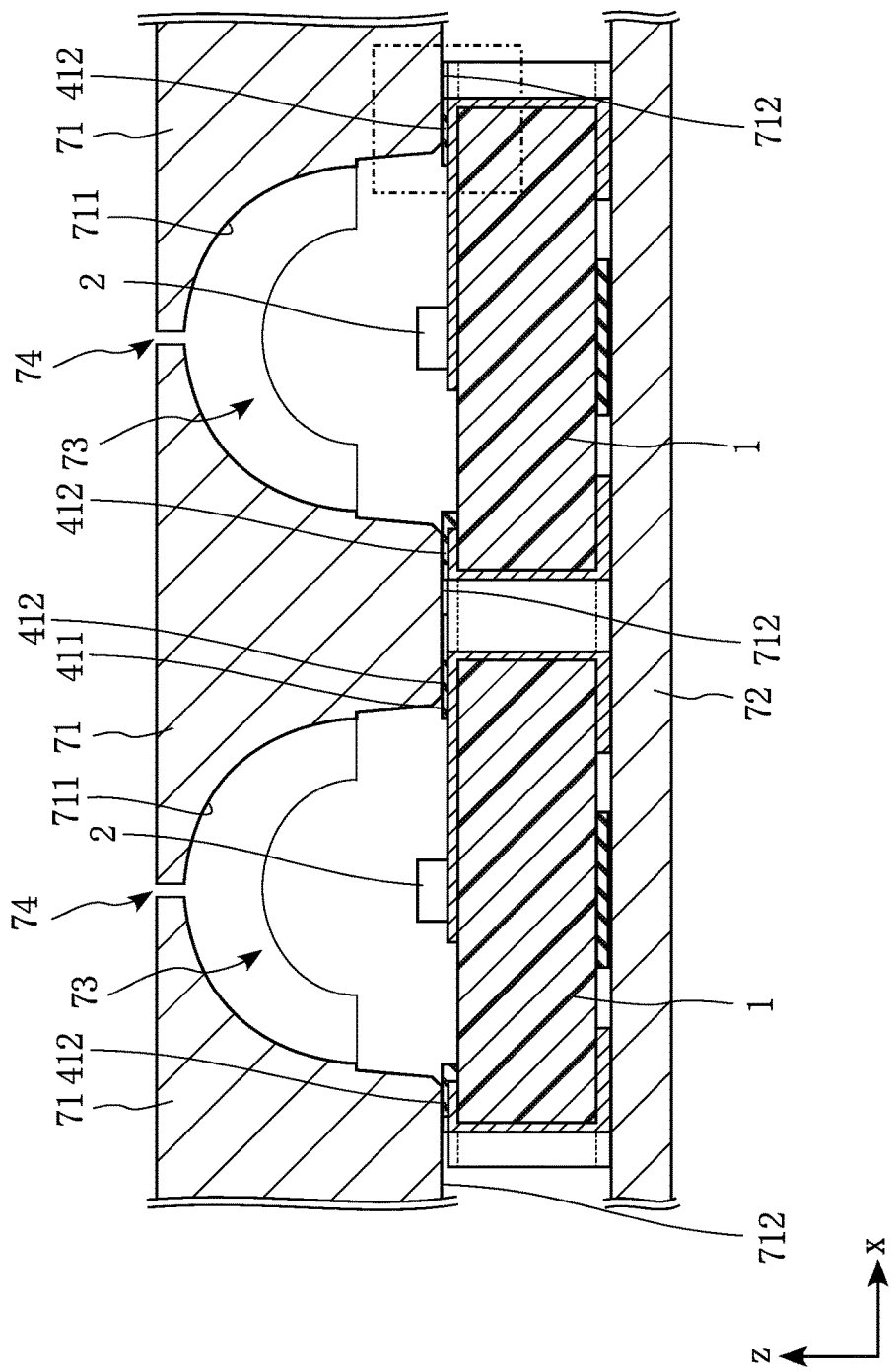
FIG. 13 is a sectional view taken along line XIII-XIII in FIG. 12.
Figure 14:
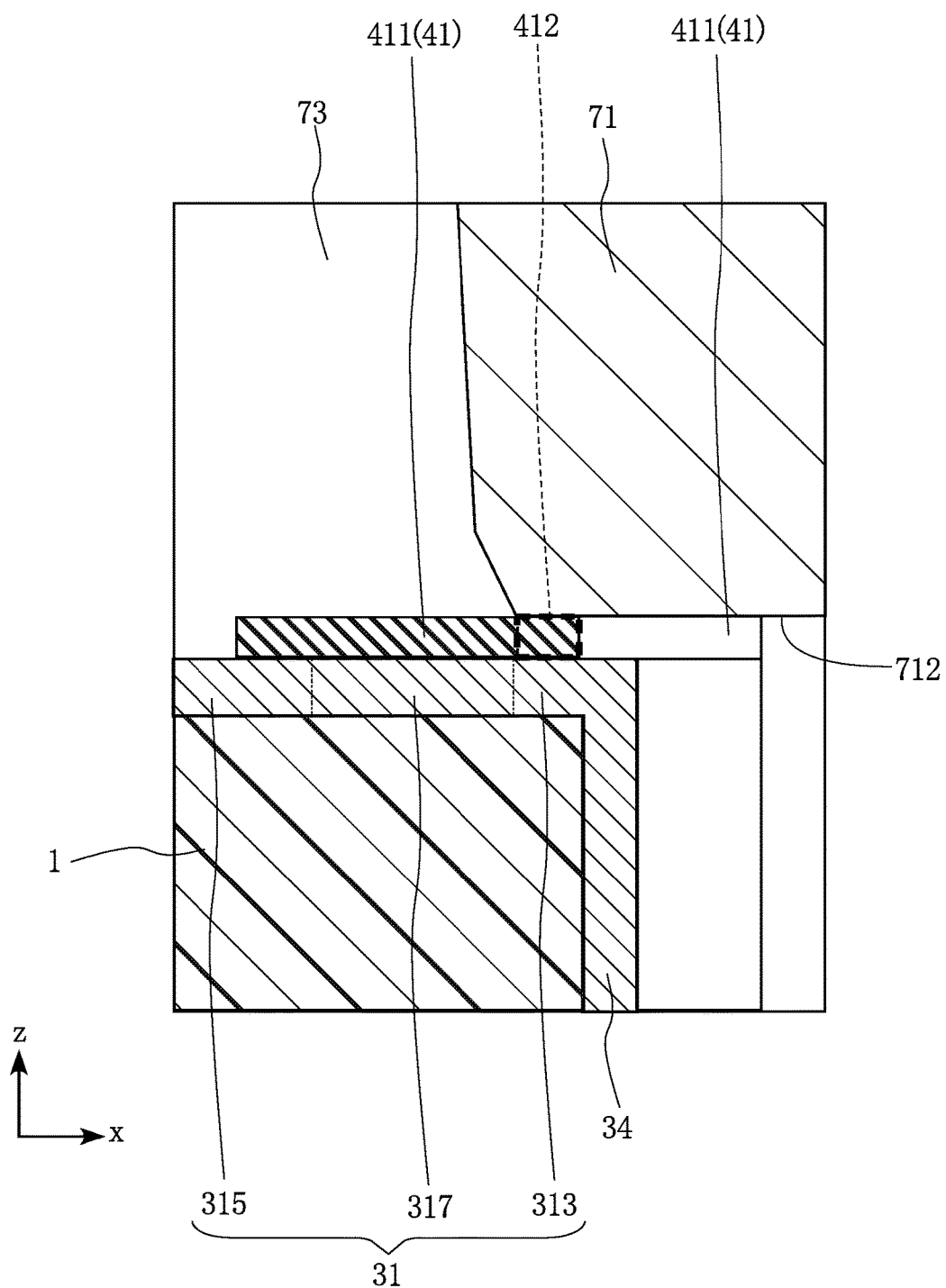
FIG. 14 is an enlarged sectional view, showing a part of FIG. 13.

As shown in FIGS. 13 and 14, in the resin molding step, the sealing resin 6 is molded on the aggregate base 100d. FIG. 13 is a sectional view taken along line XIII-XIII in FIG. 12. FIG. 14 is an enlarged view of the portion indicated by a chain line in FIG. 13. In the resin molding step, as shown in FIG. 13, the aggregate base 100 d (corresponding to a plurality of bases 1) is sandwiched between a pair of molds 71 and 72 in the z direction. The upper mold 71 is formed with a plurality of recesses 711. The dimension and the shape of each recess 711 are substantially the same as those of the sealing resin 6 shown in FIG. 1 etc. The upper mold 71 has a contact bottom surface 712 facing downward. The contact bottom surface 712 is flat (except the plurality of recesses 711). The upper mold 71 presses the aggregate base 100d from above by the contact bottom surface 712. In FIG. 12, the region pressed by the contact bottom surface 712 is surrounded by thin dotted lines (see also FIG. 11). The lower mold 72 is uniformly flat on the upper surface and presses the aggregate base 100d from below.

In the resin molding step, the aggregate base 100d is sandwiched between the upper and the lower molds 71 and 72 so that one semiconductor light-emitting element 2 is accommodated in each recess 711 of the mold 71. As a result, a cavity 73 is formed by each recess 711 and the aggregate base 100d. In the present embodiment, the following points are achieved when the aggregate base 100d is sandwiched between the molds 71 and 72. That is, (1) each resin outflow preventing portion 412 comes into contact with the contact bottom surface 712 as shown in FIG. 14, and (2) each resin outflow preventing portion 412 (in a state of contacting the contact bottom surface 712) extends continuously in the y direction from one side edge to the other side edge of the aggregate base 100d. As shown in FIG. 13, the upper mold 71 is formed with a plurality of resin injection paths 74 corresponding to the respective recesses 711. A light-transmitting resin material is filled in the cavity 73 through these resin injection paths 74, and then the filled resin material is cured. Thus, the sealing resin 6 is obtained. In the illustrated example, each resin injection path 74 is provided just above the corresponding recess 711, but the position of the resin injection path 74 is not limited thereto. In the resin molding step, since the resin outflow preventing portions 412 are in contact with the mold 71, the sealing resin 6 formed is located inward of the paired resin outflow preventing portions 412 as viewed in the z direction. That is, the resin outflow preventing portions 412 are located outside the opposite end edges of the sealing resin 6 in the x direction. By the resin molding step, the aggregate base 100e shown in FIG. 15 (the aggregate base 100d on which the sealing resin 6 is formed) is obtained.

Figure 15:
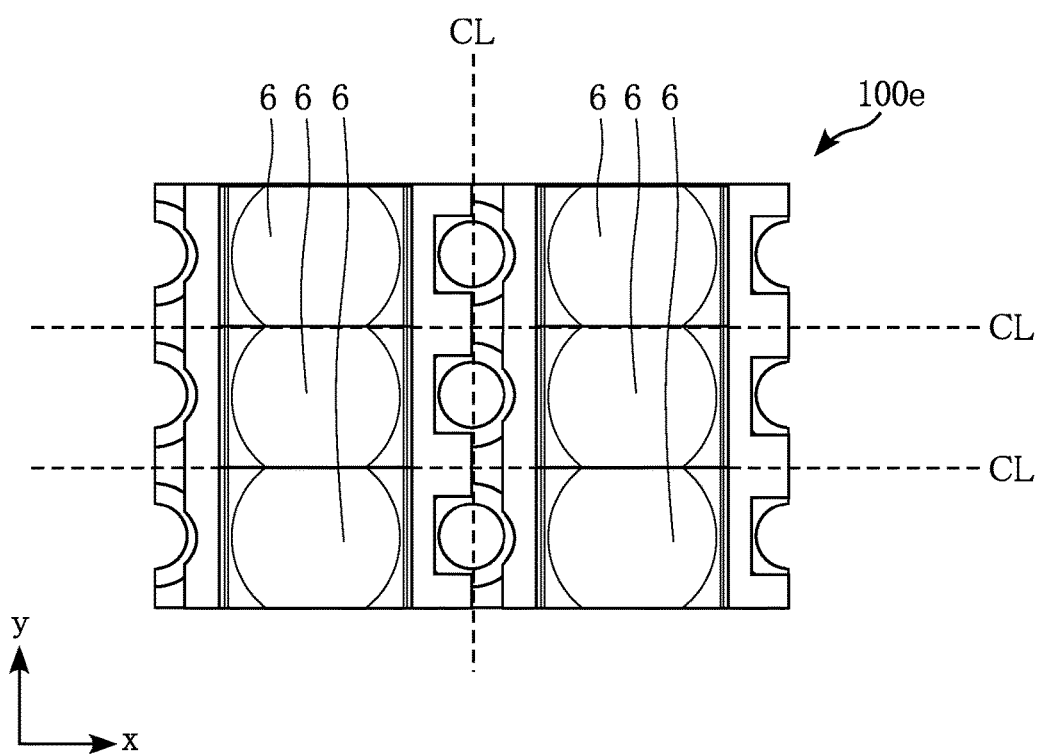
FIG. 15 illustrates a manufacturing method of the present disclosure, showing an aggregate base after a resin forming step.

As shown in FIG. 15, after the resin molding step, the aggregate base 100e is cut along a plurality of cutting lines CL. By this cutting, a plurality of semiconductor light-emitting devices A shown in FIGS. 1 to 8 are obtained. Note that, unlike this example, a plurality of semiconductor light-emitting devices A may be individually manufactured one by one.

Next, the advantages of the semiconductor light-emitting device A and its manufacturing method are described.

As described above, each pattern-covering portion 411 has a resin outflow preventing portion 412. In the resin molding step, the resin outflow preventing portion 412 is in contact with the contact bottom surface 712 of the mold 71 over a predetermined length. Thus, when the aggregate base 100d is sandwiched between the paired molds 71 and 72, formation of a gap between the mold 71 and the aggregate base 100d is prevented. More specifically, the mold 71 can press a portion that has no step and extends continuously from one side surface to the other side surface of the aggregate base 100d (from one second side surface 15 to the other second side surface 16 for the individual semiconductor light-emitting device A). As a result, formation of gaps is prevented and eventually leakage of the injected resin material from the cavity 73 is prevented.

According to the present embodiment, the both end edges in the x direction of the sealing resin 6 are in contact with the resist layer 4. The sealing resin 6 has higher bonding ability to the resist layer 4 than to the wiring pattern 3. Thus, the bonding ability of the opposite end edges in the x direction of the sealing resin 6 is enhanced. This can reduce peeling of the sealing resin 6.

According to the present embodiment, in the resin molding step, the resin outflow preventing portions 412 and the mold 71 (the contact bottom surface 712) are continuously in contact with each other from one side surface to the other side surface of the aggregate base 100d. Thus, resin leakage is prevented without increasing the clamping force of the molds 71 and 72 sandwiching the aggregate base 100d. In the resin molding step for a conventional semiconductor light-emitting device, it may be possible to increase the clamping force of the mold to prevent the formation of a gap with the base. However, if the clamping force of the mold is increased, the base cannot bear the force, which causes another problem such as cracking of the base. Such a problem is particularly noticeable in the case of a thin semiconductor light-emitting device. On the other hand, according to the above-described manufacturing method of the present disclosure, it is not necessary to increase the clamping force of the molds 71 and 72 in the resin molding step. Thus, problems such as cracking of the base can be reduced. In addition, it is unnecessary to use a molding machine capable of pressing with a high clamping force, which can contribute to suppression of the manufacturing cost.

In the resist forming step of the present embodiment, the obverse-side resist 41 is formed using a film resist. A film resist provides better patterning accuracy than liquid resist. Thus, the film resist can be formed at a position close to the grooves 131, 141 by up to about 0.05 mm. On the other hand, a liquid resist can only be formed a distance of 0.125 mm or more away from the grooves 131, 141. Thus, using a film resist allows the resin outflow preventing portions 412 to be formed easily at predetermined positions. In addition, since the film resist is formed by attaching by pressure-bonding, a flat surface is provided easily as compared with the case of applying a liquid resist. Thus, the upper surface of the resin outflow preventing portion 412 can be easily made flat and hence can be brought into close contact with the mold 71. Note that a liquid resist may be used instead of the film resist if patterning precision is not an important concern, for example. For example, the obverse-side resist 41 may be formed by a liquid solder resist.

In the resin molding step of the present embodiment, the mold 71 (the contact bottom surface 712) comes into direct contact with the resin outflow preventing portion 412 (the resist layer 4), but does not come into contact with the wiring pattern 3. Thus, the clamping force does not unduly affect the wiring pattern 3 and hence does not cause the wiring pattern 3 to break, for example.

The arrangement positions of the wiring pattern 3 and the resist layer 4 are not limited to those of the above-described embodiment. In the individual semiconductor light-emitting device A, the arrangement of the wiring pattern 3 and the resist layer 4 can be variously changed as long as the resin outflow preventing portions 412 (which come into contact with the contact bottom surface 712 in the resin molding step) are continuous from one second side surface 15 to the other second side surface 16. Variations in which one or both of the wiring pattern 3 and the resist layer 4 are different from the above semiconductor light-emitting device A are described below. Note that the same or similar configuration as the semiconductor light-emitting device A is denoted by the same reference numeral, and description thereof is omitted.

FIG. 16 illustrates semiconductor light-emitting devices A1-A3 according to variations of the present disclosure. In FIG. 16, as in FIG. 6, illustration of the sealing resin 6 is omitted. Further, the contact bottom surface 712 of the mold 71 is indicated by dotted lines. FIG. 16 shows a state before the resin material is filled in the cavity 73 in the resin molding step.

In the semiconductor light-emitting device A1, the pattern-covering portion 411 covers only a part of the first strip portion 317. In the semiconductor light-emitting device A2, the obverse-side resist 41 has a curved end edge (left end edge extending in the y direction in the figure). In the semiconductor light-emitting device A3, the wiring pattern 3 (the first strip portion 317) has a different shape.

Also in the semiconductor light-emitting devices A1 to A3, the resin outflow preventing portion 412 indicated by a bold dotted line extends continuously in the y direction from the second side surface 15 to the second side surface 16. Thus, also in these variations, similarly to the above embodiment, the effect of preventing resin from flowing out from the mold is exerted.

Figure 17:
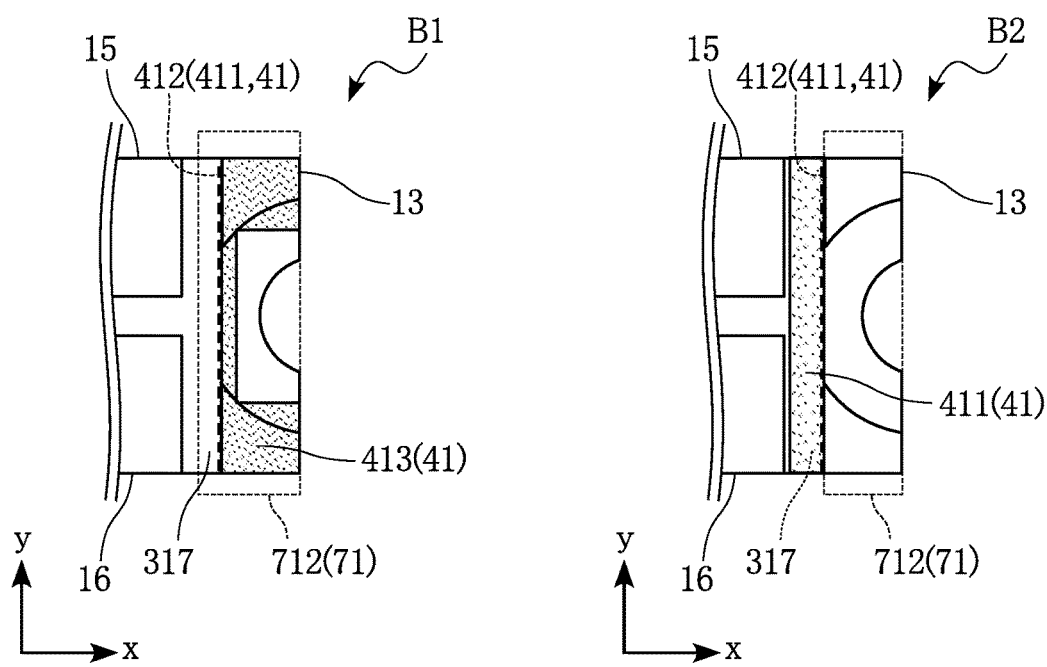
FIG. 17 illustrates a semiconductor light-emitting device according to a plurality of other variations of the present disclosure.

FIG. 17 illustrates semiconductor light-emitting devices B1 and B2 according to other variations of the present disclosure. In the semiconductor light-emitting devices B1 and B2, the resin outflow preventing portion 412 is substantially linear as viewed in the z direction (that is, the dimension in the x direction of the resin outflow preventing portion 412 is very small).

In the semiconductor light-emitting device B1, the right end edge of the first strip portion 317 and the left end edge of the obverse-side resist 41 (pattern-covering portion 411) coincide with each other as viewed in the z direction. In the semiconductor light-emitting device B2, the right end edge of the first strip portion 317, the right end edge of the obverse-side resist 41 (pattern-covering portion 411), and the left end edge of the contact bottom surface 712 of the mold 71 coincide with each other as viewed in the z direction. Also in the semiconductor light-emitting devices B1 and B2, the resin outflow preventing portion 412 extends continuously from one second side surface 15 to the other second side surface 16. Therefore, also in these variations, the effect of preventing resin from flowing out from the mold is exerted.

In the semiconductor light emitting devices A, A1 to A3, B1 and B2, the case where the thickness of the base-covering portion 413 is smaller than the sum of the thickness of the wiring pattern 3 and the thickness of the pattern-covering portion 411 is described as an example. Alternatively, for example, the thickness of the base-covering portion 413 may be the same as the sum of the thickness of the wiring pattern 3 and the thickness of the pattern-covering portion 411. For example, the thickness of the base-covering portion 413 may be 48 μm, the thickness of the wiring pattern 3 may be 33 μm, and the thickness of the pattern-covering portion 411 may be 15 μm. In this case, in the resin molding step, not only pattern-covering portion 411 but also the base-covering portion 413 come into contact with the mold 71. Therefore, since the contact area between the mold 71 and the covering portion is increased, resin leakage can be more effectively prevented. In addition, the pattern-covering portion 411 may not extend from one second side surface 15 to the other second side surface 16. In this case, for example, it may be sufficient that the combination of the base-covering portion 413 and the pattern-covering portion 411 extend continuously from the second side surface 15 to the second side surface 16.

The semiconductor light-emitting device and the manufacturing method thereof according to the present disclosure are not limited to the above-described embodiments. The specific structure of each part of the semiconductor light-emitting device of the present disclosure and the specific procedure and technique of each step of the manufacturing method can be variously changed in design.

The invention claimed is:

1. A semiconductor light-emitting device comprising:
a base including a base obverse surface and a base reverse surface spaced apart from each other in a first direction, including a pair of first side surfaces spaced apart from each other in a second direction perpendicular to the first direction, and including a pair of second side surfaces spaced apart from each other in a third direction perpendicular to the first direction and the second direction;
a semiconductor light-emitting element mounted on the base obverse surface;
a light-transmitting sealing resin covering the semiconductor light-emitting element and having a smaller dimension than the base as viewed in the first direction;
a wiring pattern electrically connected to the semiconductor light-emitting element and including an obverse surface electrode formed on the base obverse surface; and
an insulating resist layer including a pattern-covering portion overlapping with the obverse surface electrode, the resist layer being spaced apart from one of the pair of first side surfaces and overlapping with the other one of the pair of first side surfaces as viewed in the first direction,
wherein the pattern-covering portion includes a resin outflow preventing portion, and as viewed in the first direction, the resin outflow preventing portion is disposed outside the sealing resin and extends continuously from one of the paired second side surfaces to the other one of the paired second side surfaces.

2. The semiconductor light-emitting device according to claim 1, wherein the resin outflow preventing portion is substantially linear, the sealing resin includes an end edge extending in the third direction, and the end edge overlaps with the resin outflow preventing portion.

3. The semiconductor light-emitting device according to claim 1, wherein the paired first side surfaces are formed with a first groove and a second groove, respectively, that extend from the base obverse surface to the base reverse surface.

4. The semiconductor light-emitting device according to claim 3, wherein the first groove and the second groove are semicircular as viewed in the first direction.

5. The semiconductor light-emitting device according to claim 3, wherein the wiring pattern includes a first side surface electrode and a second side surface electrode formed at the first groove and the second groove, respectively, and the first side surface electrode and the second side surface electrode are electrically connected to the obverse surface electrode.

6. The semiconductor light-emitting device according to claim 5, wherein the wiring pattern includes a first reverse surface electrode and a second reverse surface electrode that are formed on the base reverse surface, and the first reverse surface electrode and the second reverse surface electrode are electrically connected to the first side surface electrode and the second side surface electrode, respectively.

7. The semiconductor light-emitting device according to claim 6, wherein the first reverse surface electrode and the second reverse surface electrode are spaced apart and electrically insulated from each other.

8. The semiconductor light-emitting device according to claim 7, further comprising an insulator provided between the first reverse surface electrode and the second reverse surface electrode.

9. The semiconductor light-emitting device according to claim 5, further comprising a wire connecting the semiconductor light-emitting element and the wiring pattern.

10. The semiconductor light-emitting device according to claim 9, wherein the obverse surface electrode includes a die bonding portion to which the semiconductor light-emitting element is fixed and a wire bonding portion to which an end of the wire is fixed.

11. The semiconductor light-emitting device according to claim 10, wherein the semiconductor light-emitting element is provided with a first pad portion and a second pad portion, the first pad portion is connected to another end of the wire, and the second pad portion is connected to the die bonding portion via a conductive bonding material.

12. The semiconductor light-emitting device according to claim 10, wherein the obverse surface electrode includes a first end edge portion and a first connecting portion, the first end edge portion is disposed close to the first groove and electrically connected to the first side surface electrode, and the first connecting portion electrically connects the first end edge portion and the die bonding portion.

13. The semiconductor light-emitting device according to claim 12, wherein the base obverse surface includes a first side edge and a second side edge spaced apart from each other in the third direction, the obverse surface electrode includes a first strip portion connected to the first connecting portion, and the first strip portion extends from the first side edge to the second side edge.

14. The semiconductor light-emitting device according to claim 13, wherein the resin outflow preventing portion overlaps with the first strip portion as viewed in the first direction.

15. The semiconductor light-emitting device according to claim 10, wherein the obverse surface electrode includes a second end edge portion and a second connecting portion, the second end edge portion is disposed close to the second groove and electrically connected to the second side surface electrode, and the second connecting portion electrically connects the second end edge portion and the wire bonding portion.

16. The semiconductor light-emitting device according to claim 15, wherein the base obverse surface includes a first side edge and a second side edge spaced apart from each other in the third direction, the obverse surface electrode includes a second strip portion connected to the second connecting portion, and the second strip portion extends from the first side edge to the second side edge.

17. The semiconductor light-emitting device according to claim 16, further comprising an additional resin outflow preventing portion, the additional resin outflow preventing portion overlapping with the second strip portion as viewed in the first direction.

18. The semiconductor light-emitting device according to claim 1, wherein the wiring pattern is made of Cu.

19. The semiconductor light-emitting device according to claim 18, wherein the wiring pattern includes a portion exposed from the sealing resin and the resist layer, and the exposed portion is plated with Au.

20. The semiconductor light-emitting device according to claim 1, wherein the sealing resin comprises one of an epoxy resin, a silicone resin, an acrylic resin, or a polyvinyl-based resin.

21. The semiconductor light-emitting device according to claim 1, wherein the sealing resin includes a dome portion protruding in the first direction.

22. The semiconductor light-emitting device according to claim 3, wherein the resist layer includes an edge extending in the third direction from one of the pair of second side surfaces to the other one of the pair of second side surfaces, the edge of the resist layer being formed with a curved portion along one of the first groove and the second groove as viewed in the first direction.

23. The semiconductor light-emitting device according to claim 1, wherein the resist layer includes a part disposed between the sealing resin and the base obverse surface, said part being held in direct contact with the sealing resin and the base obverse surface.

24. The semiconductor light-emitting device according to claim 1, wherein the resist layer includes a side face that is flush with the other one of the pair of first side surfaces.

25. The semiconductor light-emitting device according to claim 23, wherein said part of the resist layer includes an upper surface that is flush with an upper surface of the resin outflow preventing portion.

26. A semiconductor light-emitting device comprising:
a base including a base obverse surface and a base reverse surface spaced apart from each other in a first direction, including a pair of side surfaces spaced apart from each other in a second direction perpendicular to the first direction;
a semiconductor light-emitting element mounted on the base obverse surface;
a sealing resin covering the semiconductor light-emitting element and having a smaller dimension than the base as viewed in the first direction;
a first obverse surface electrode formed on the base obverse surface and electrically connected to the semiconductor light-emitting element;
a second obverse surface electrode formed on the base obverse surface and electrically connected to the semiconductor light-emitting element;
a first insulating resist layer overlapping with the first obverse surface electrode as viewed in the first direction; and
a second insulating resist layer overlapping with the second obverse surface electrode as viewed in the first direction,
wherein the first insulating resist layer and the second insulating resist layer are spaced apart from each other,
each of the first insulating resist layer and the second insulating resist layer comprises a resin outflow preventing portion that is disposed outside the sealing resin and extends continuously from one of the paired side surfaces to the other one of the paired side surfaces.

27. The semiconductor light-emitting device according to 26, wherein the base includes a pair of additional side surfaces spaced apart from each other in a third direction perpendicular to the first direction and the second direction, and the pair of additional side surfaces are formed with a first groove and a second groove, respectively, that extend from the base obverse surface to the base reverse surface.

28. The semiconductor light-emitting device according to claim 27, wherein the first groove and the second groove are semicircular as viewed in the first direction.

29. The semiconductor light-emitting device according to claim 27, wherein the first insulating resist layer includes an edge extending in the third direction from said one of the pair of side surfaces to the other one of the pair of side surfaces, said edge of the first insulating resist layer being formed with a curved portion along the first groove as viewed in the first direction.

30. The semiconductor light-emitting device according to claim 27, further comprising a first side surface electrode and a second side surface electrode, wherein the first side surface electrode is disposed at the first groove and electrically connected to the first obverse surface electrode, and the second side surface electrode is disposed at the second groove and electrically connected to the second obverse surface electrode.

31. The semiconductor light-emitting device according to claim 30, further comprising a first reverse surface electrode and a second reverse surface electrode, wherein the first reverse surface electrode is formed on the base reverse surface and electrically connected to the first side surface electrode, and the second reverse surface electrode is formed on the base reverse surface and electrically connected to the second side surface electrode.

32. The semiconductor light-emitting device according to claim 31, wherein the first reverse surface electrode and the second reverse surface electrode are spaced apart and electrically insulated from each other.

33. The semiconductor light-emitting device according to claim 32, further comprising an insulator provided between the first reverse surface electrode and the second reverse surface electrode.

34. The semiconductor light-emitting device according to claim 26, wherein the first obverse surface electrode includes a die bonding portion to which the semiconductor light-emitting element is fixed.

35. The semiconductor light-emitting device according to claim 34, further comprising a wire connecting the semiconductor light-emitting element and the second obverse surface electrode, wherein the second obverse surface electrode includes a wire bonding portion to which an end of the wire is fixed.

36. The semiconductor light-emitting device according to claim 35, wherein the semiconductor light-emitting element is provided with a first pad portion and a second pad portion, the first pad portion is connected to another end of the wire, and the second pad portion is connected to the die bonding portion via a conductive bonding material.

37. The semiconductor light-emitting device according to claim 35, wherein the first obverse surface electrode includes a first edge portion and a first connecting portion, the first edge portion is disposed close to the first groove and electrically connected to the first side surface electrode, and the first connecting portion electrically connects the first edge portion and the die bonding portion.

38. The semiconductor light-emitting device according to claim 37, wherein the base obverse surface includes a first side edge and a second side edge spaced apart from each other in the third direction, the first obverse surface electrode includes a first strip portion connected to the first connecting portion, and the first strip portion extends from the first side edge to the second side edge.

39. The semiconductor light-emitting device according to claim 38, wherein the resin outflow preventing portion of the first insulating resist layer overlaps with the first strip portion as viewed in the first direction.

40. The semiconductor light-emitting device according to claim 35, wherein the second obverse surface electrode includes a second edge portion and a second connecting portion, the second edge portion is disposed close to the second groove and electrically connected to the second side surface electrode, and the second connecting portion electrically connects the second edge portion and the wire bonding portion.

41. The semiconductor light-emitting device according to claim 40, wherein the base obverse surface includes a first side edge and a second side edge spaced apart from each other in the third direction, the second obverse surface electrode includes a second strip portion connected to the second connecting portion, and the second strip portion extends from the first side edge to the second side edge.

42. The semiconductor light-emitting device according to claim 26, wherein the first obverse surface electrode and the second obverse surface electrode are made of Cu.

43. The semiconductor light-emitting device according to claim 42, wherein the first obverse surface electrode includes a portion exposed from the sealing resin and the first insulating resist layer, and the exposed portion is plated with Au.

44. The semiconductor light-emitting device according to claim 42, wherein the second obverse surface electrode includes a portion exposed from the sealing resin and the second insulating resist layer, and the exposed portion is plated with Au.

45. The semiconductor light-emitting device according to claim 26, wherein the sealing resin comprises one of an epoxy resin, a silicone resin, an acrylic resin, or a polyvinyl-based resin.

46. The semiconductor light-emitting device according to claim 26, wherein the sealing resin includes a dome portion protruding in the first direction.

47. The semiconductor light-emitting device according to claim 26, wherein the first insulating resist layer includes a pair of side edges spaced apart from each other in the second direction and each extending in a third direction perpendicular to the first direction and the second direction, each of the pair of side edges being formed with a curved portion.

48. The semiconductor light-emitting device according to claim 26, wherein each of the first insulating resist layer and the second insulating resist layer comprises a base covering portion held in direct contact with the base obverse surface and exposed from the sealing resin.

* * * * *